United States Patent
Clifford

(10) Patent No.: US 8,775,981 B1
(45) Date of Patent: Jul. 8, 2014

(54) CORRECTING FOR OVEREXPOSURE DUE TO OVERLAPPING EXPOSURES IN LITHOGRAPHY

(71) Applicant: GLOBALFOUNDRIES Inc., Grand Cayman (KY)

(72) Inventor: Christopher H. Clifford, San Francisco, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/770,287

(22) Filed: Feb. 19, 2013

(51) Int. Cl.
*G06F 17/50* (2006.01)

(52) U.S. Cl.
USPC .............. 716/53; 716/50; 716/54; 716/55

(58) Field of Classification Search
CPC ........... G06F 1/144; G06F 1/36; G06F 7/705; G06F 7/70441; G06F 17/5068; G06F 2217/12; G06G 17/5081; H01L 22/20
USPC .......................................... 716/50, 53, 54, 55
See application file for complete search history.

(56) References Cited

U.S. PATENT DOCUMENTS

| | | | |
|---|---|---|---|
| 6,937,337 B2* | 8/2005 | Ausschnitt et al. ............ 356/401 |
| 7,455,939 B2* | 11/2008 | Brunner et al. ................... 430/5 |
| 8,227,151 B2 | 7/2012 | Inanami et al. |
| 2002/0091985 A1* | 7/2002 | Liebmann et al. ............... 716/19 |
| 2009/0011342 A1* | 1/2009 | Brunner et al. .................... 430/5 |
| 2010/0208978 A1 | 8/2010 | Terasawa et al. |
| 2010/0323282 A1 | 12/2010 | Uno et al. |
| 2011/0262867 A1 | 10/2011 | Uno et al. |
| 2012/0198395 A1 | 8/2012 | Arisawa et al. |
| 2012/0224156 A1 | 9/2012 | Lee et al. |
| 2012/0284675 A1 | 11/2012 | Shiely et al. |
| 2013/0104091 A1 | 4/2013 | Komirenko et al. |
| 2013/0185681 A1* | 7/2013 | Liu et al. ......................... 716/51 |

* cited by examiner

*Primary Examiner* — Vuthe Siek
*Assistant Examiner* — Magid Dimyan
(74) *Attorney, Agent, or Firm* — Amerson Law Firm, PLLC

(57) ABSTRACT

A method includes receiving a layout file for a reticle used to pattern a first die location in a computing apparatus, the layout file defining a plurality of kerf features. A flare map calculation area for the first die location covering at least a portion of a kerf region surrounding the first die location is defined in the computing apparatus. Features in the layout file into the region corresponding to the flare map calculation area that are associated with the patterning of die locations neighboring the first die location are copied in the computing apparatus to generate a modified layout file. A flare map of the portion of the kerf region included in the flare map calculation area based on the modified layout file is calculated in the computing apparatus.

13 Claims, 5 Drawing Sheets

CORRECTING FOR OVEREXPOSURE DUE TO OVERLAPPING EXPOSURES IN LITHOGRAPHY

BACKGROUND

The disclosed subject matter relates generally to semiconductor device manufacturing and, more particularly, to a method and apparatus for performing double exposure photolithography using a single reticle.

Semiconductor devices, or microchips, are manufactured from wafers of a substrate material. Layers of materials are added, removed, and/or treated during fabrication to create the integrated, electrical circuits that make up the device. The fabrication essentially comprises four operations: layering, or adding thin layers of various materials to a wafer from which a semiconductor is produced; patterning, or removing selected portions of added layers; doping, or placing specific amounts of dopants in the wafer surface through openings in the added layers; and heat treatment, or heating and cooling the materials to produce desired effects in the processed wafer. Although there are only four basic operations, they can be combined in hundreds of different ways, depending upon the particular fabrication process.

The fabrication process generally involves processing a number of wafers through a series of fabrication tools. Each fabrication tool performs one or more of the four basic operations. The four basic operations are performed in accordance with an overall process to finally produce wafers from which the semiconductor devices are obtained.

Of these four operations, patterning is considered to be an important step affecting the performance of the completed devices. Patterning is known to those in the art by many names. Other names for patterning include photolithography, photomasking, masking, oxide removal, metal removal, and microlithography. The term "photolithography" will hereafter be used to refer to patterning operations. Photolithography typically involves a machine called an "exposure tool," or sometimes also called a "stepper" or a "scanner". An exposure tool positions a portion of a wafer being processed under a "photomask." The photomask is usually a reticle, which is a copy of a pattern created in a layer of chrome on a glass plate. Light is then transmitted through the reticle onto a thin layer of material called photoresist previously added to the wafer. The chrome blocks the light while the glass allows it to pass. This type of reticle is referred to as a binary mask. Another type of photomask is a "phase shift" photomask that shifts the phase of the light waves so that the projected image of the photomask has an improvement of one or more image characteristics (e.g., contrast, edge definition, etc.) as compared with the same pattern from a binary photomask. In some cases, multiple reticles are used for a single patterning step. The use of multiple reticles allows patterns to be formed that have pitches smaller than would be achievable with a single reticle.

It is common in photolithography for the exposure field size to be larger than the stepping distance on the wafer. To address this issue, fabricators typically generate a flare map for the reticle that estimates the intensity components due to the overexposure. However, conventional flare maps only consider the overexposure due to the patterning of the subject die location. In an actual fabrication process, the overexposure can also be affected by the patterning of neighboring die.

This multiple exposure approach leads to overlapping frame patterns around the border of the field. In situations where the reflection of "dark" areas on the mask cannot be ignored, such as extreme ultraviolet (EUV) lithography, this over exposure will cause the resist features in this area to be printed too small.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method that includes receiving a layout file for a reticle used to pattern a first die location in a computing apparatus, the layout file defining a plurality of kerf features. A flare map calculation area for the first die location covering at least a portion of a kerf region surrounding the first die location is defined in the computing apparatus. Features in the layout file into the region corresponding to the flare map calculation area that are associated with the patterning of die locations neighboring the first die location are copied in the computing apparatus to generate a modified layout file. A flare map of the portion of the kerf region included in the flare map calculation area based on the modified layout file is calculated in the computing apparatus.

Another aspect of the disclosed subject matter is seen in a non-transitory program storage device programmed with instructions, that when executed in a computing apparatus, perform a method that includes receiving a layout file for a reticle used to pattern a first die location in a computing apparatus, the layout file defining a plurality of kerf features. A flare map calculation area for the first die location covering at least a portion of a kerf region surrounding the first die location is defined in the computing apparatus. Features in the layout file into the region corresponding to the flare map calculation area that are associated with the patterning of die locations neighboring the first die location are copied in the computing apparatus to generate a modified layout file. A flare map of the portion of the kerf region included in the flare map calculation area based on the modified layout file is calculated in the computing apparatus.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
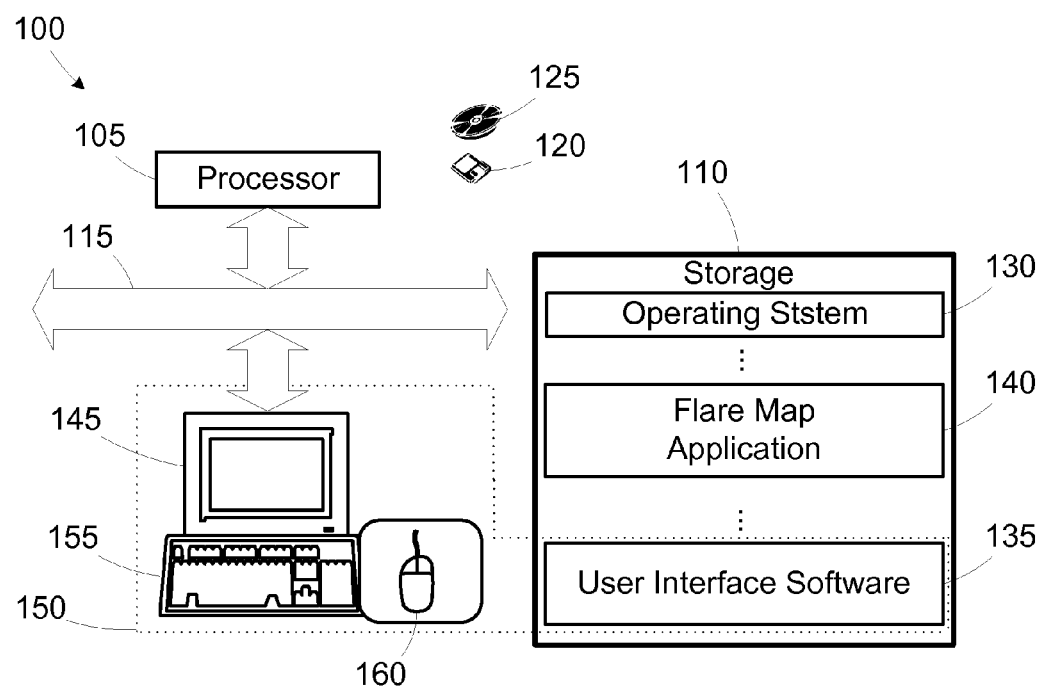
FIG. 1 is a simplified block diagram of a computing apparatus that may be used to implement flare mapping techniques in accordance with some aspects of the present subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the present subject matter shall be described in the context of an illustrative computing apparatus 100 for performing photolithography analysis for semiconductor devices. For example the computing apparatus 100 may perform a flare map analysis to facilitate optical correction for a photolithography process.

The computing apparatus 100 includes a processor 105 communicating with storage 110 over a bus system 115. The storage 110 may include a hard disk and/or random access memory ("RAM") and/or removable storage, such as a magnetic disk 120 or an optical disk 125. The storage 110 is also encoded with an operating system 130, user interface software 135, and a flare map application 165. The user interface software 135, in conjunction with a display 140, implements a user interface 145. The user interface 145 may include peripheral I/O devices such as a keypad or keyboard 150, mouse 155, etc. The processor 105 runs under the control of the operating system 130, which may be practically any operating system known in the art. The flare map application 165 is invoked by the operating system 130 upon power up, reset, user interaction, etc., depending on the implementation of the operating system 130. The flare map application 165, when invoked, performs a method of the present subject matter. The user may invoke the flare map application 165 in conventional fashion through the user interface 145. Note that although a stand-alone system is illustrated, there is no need for the data to reside on the same computing apparatus 100 as the flare map application 165 by which it is processed. Some embodiments of the present subject matter may therefore be implemented on a distributed computing system with distributed storage and/or processing capabilities.

Figure 2:
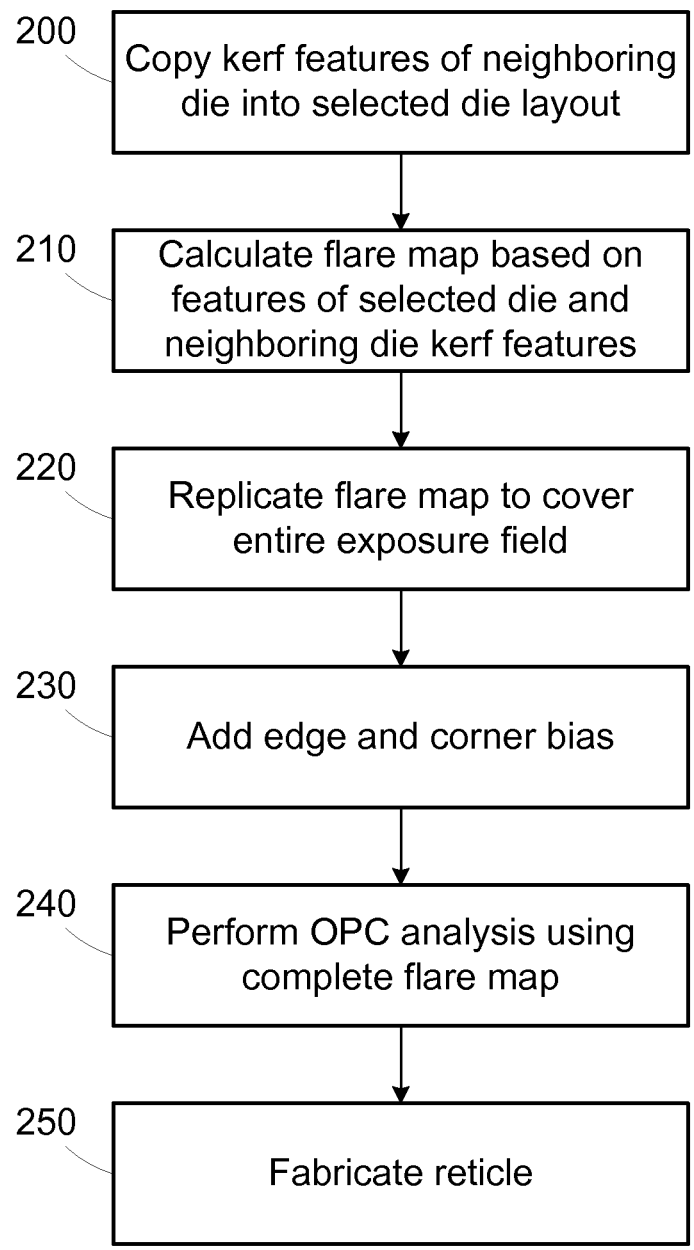
FIG. 2 is a simplified flow diagram of a method implemented by the system of FIG. 1.

It is contemplated that, in some embodiments, the flare map application 165 may be executed by the computing apparatus 100. Data for the flare map analysis may be stored on a computer readable storage device (e.g., storage 110, disks 120, 125, solid state storage, and the like). FIG. 2 illustrates a simplified flow diagram of the technique implemented by the flare map application 165 in generating the flare map.

Portions of the subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Figure 3:
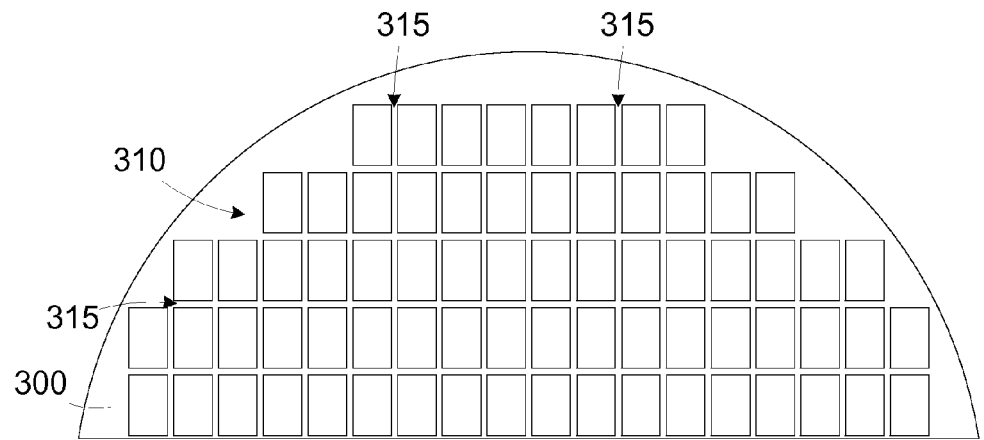
FIG. 3 is a diagram of a wafer illustrating die and kerf regions.

FIG. 3 shows a portion of a wafer 300. Die regions 310 are generally arranged in a grid pattern. A kerf region 315 is defined between the die regions 310. The kerf region 315 is the region in which a saw is used to singulate the completed die. It is common to form test features in the kerf region 315 to allow metrology data to be collected during the fabrication process of the wafer 300. The test features are destroyed when the die are singulated. To pattern features on the wafer 300, a reticle is positioned by an imaging subsystem so that it overlaps the grid at a die region 310, and the wafer 300 is exposed.

Figure 4:
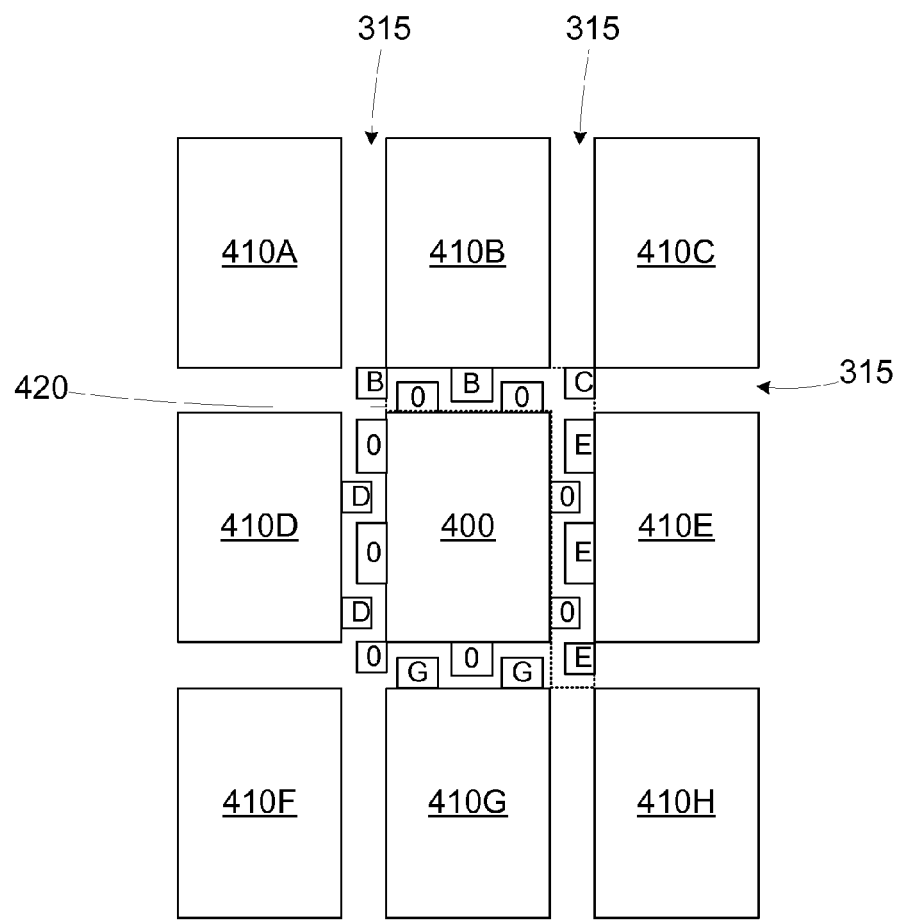
FIG. 4 is a diagram illustrating a selected die location and its neighboring die locations to illustrate overlapping lithography exposures.

FIG. 4 illustrates a view of a selected die location 400 and its neighboring die locations 410A-H. The exposure at the selected die location 400 is affected by the exposures at the neighboring die locations 410A-H. The die location 400 and its neighbors print test features in the kerf region 315. For ease of illustration, the features associated with each die location are shown as abutting the die location, however, the particular placement of the test features in the kerf region 315 and the way they are interleaved may vary depending on particular implementation. Because, different die location contributes to the features formed in the kerf region 315, the kerf area is subjected to multiple exposures.

In a conventional photolithography design process, a flare map is calculated for the kerf regions 315 surrounding the selected die location 400 using only the features defined for that die on the reticle, as denoted in FIG. 4 by a "0" in the features. The flare map is a pixel by pixel intensity estimate resulting from the exposure to create the features at the die location 400. Techniques for generating the flare map based on the defined features are known to those of ordinary skill in the art. Software that may be used for calculating the flare map using the defined reticle features is the Calibre® system offered by Mentor Graphics Corporation of Wilsonville, Oreg. The conventional approach does not address the effects of the exposures for the adjacent die that also pattern the kerf region 315 to form the features associated with the other die, denoted by their respective die letters.

In accordance with the present subject matter, a flare map calculation region 420 is defined for the selected die location 400. The coverage of the flare map calculation region 420 may vary depending on the particular implementation. In the illustrated embodiment, the size of the flare map calculation region 420 is selected to take advantage of the symmetry of the pattern.

Figure 5A:
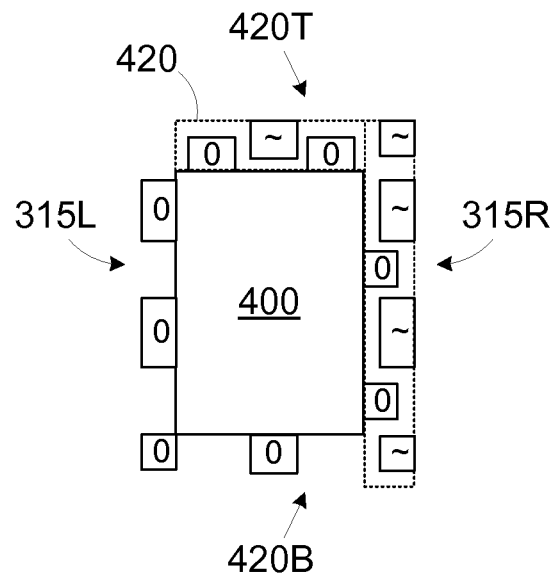
FIGS. 5A and 5B illustrate the copying of features in the reticle layout that are printed during the exposures of neighboring die locations.

Referring to FIG. 2, the features of the neighboring die locations that lie within the flare map calculation region 420 are used in the generation of the flare map. As set forth in method block 200, the layouts of the kerf features B, C, and E are added to the layout plan of the selected die location 400. These features are actually present in the layout of the selected die location 400 due to the interleaving of the features. The copying of the features of the surrounding die locations may be implemented using a script that identifies the interleaved features. For example, the script would copy the "0" features of the selected die location 400 in the left kerf region 315L to the right kerf region 315R and the "0" features from the bottom kerf region to the top kerf region, as denoted by the features with a "~". Due to the interleaving of the features, the "0" features and the "~" features do not overlap, as illustrated in FIG. 5A. Hence, the features within the flare map calculation region 420 represent all of the kerf features from all of the die locations that contribute to the patterning of the selected kerf region 315.

Figure 5B:
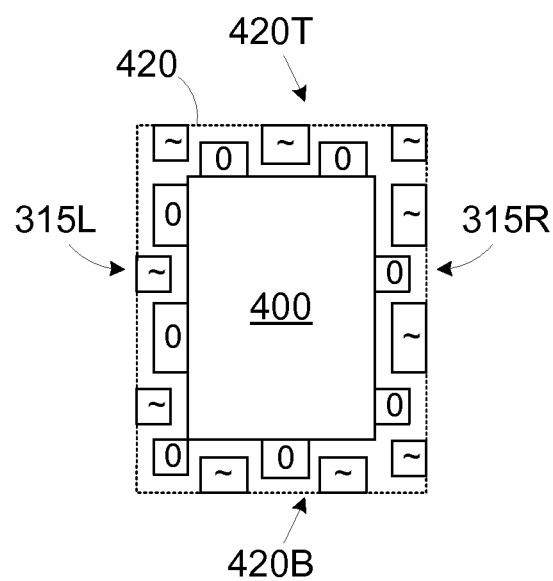

In another embodiment, illustrated in FIG. 5B, the flare map calculation region 420' may cover the entire kerf region 315 around the selected die location 400. In that embodiment, the features of all the surrounding die locations A-H that print in the kerf region 315 would be copied in the layout file. For example, the script would copy the "0" features of the selected die location 400 in the left kerf region 315L to the right kerf region 315R, the "0" features of the selected die location 400 in the right kerf region 315R to the left kerf region 315L, the "0" features from the bottom kerf region 315B to the top kerf region 315T, and the "0" features from the top kerf region 315T to the bottom kerf region 315B.

Figure 6:
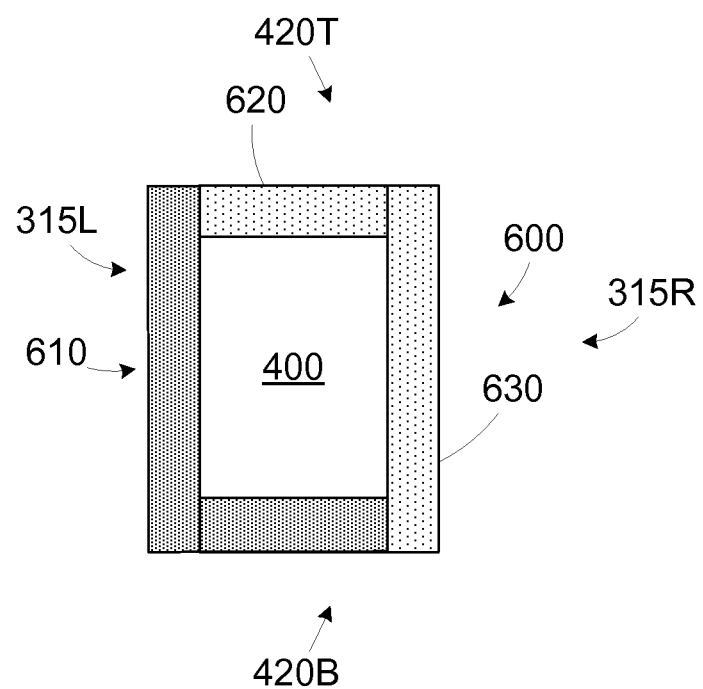
FIG. 6 is a diagram of the selected die illustrating the flare map generated using the features illustrated in FIG. 5A.

In method block 210, a flare map is calculated based on the additional features from the neighboring die location exposures. Techniques for generating the flare map are known to those of ordinary skill in the art. For example, the Calibre® system may be used. FIG. 6 illustrates a flare map 600 calculated using the features of the die location 400 as well as the kerf features B, C, E, of the neighboring die locations 410B, 410C, 410E that were copied as illustrated in FIG. 5A. The flare map 600 is replicated to generate a replicated flare map 610. A top portion 620 of the flare map 600 is replicated for the bottom kerf region 315B, and a side portion 630 of the flare map 600 is replicated for the left kerf region 315L to generate the replicated flare map 610, as set forth in method block 220. Hence, the flare map 600 and the replicated flare map 610 cover the entire exposure field associated with the die location 400.

The portions of the kerf replicated may vary. For example, the bottom region may be calculated and replicated for the top, as opposed to the top calculation illustrated. Hence, the top and bottom regions may be referred to as horizontal kerf regions, and the left and right regions may be referred to as vertical kerf regions. In a general context, the kerf regions are calculated for one horizontal kerf region and one vertical kerf region and copied for the opposing horizontal and vertical kerf regions.

If the copying were conducted as illustrated in FIG. 5B, the replication of the flare map in method block 220 would be omitted, and the flare map would cover the entire kerf region.

In some embodiments, additional flare bias may be provided to the edges and corners to account for multiple exposures of the absorber, as shown in method block 230. The determination of corner biases may be done experimentally or by simulation, and techniques for doing so are known to those of ordinary skill in the art.

In method block 240, an optical proximity correction (OPC) for the extreme ultraviolet patterning process is performed on the patterns defined for the selected die. The OPC process uses the flare map in the calculation to determine the effects of the kerf exposures on edge features and the kerf features for the selected die location 400. In general, the OPC analysis models the optical parameters of the system and predicts how the features defined in the reticle will print on the wafer and adjusts the pattern on the reticle so that the printed features more closely match the design features. The OPC analysis results in a corrected layout file that accounts for the optical patterning effects of the printed features. Techniques for performing the OPC analysis using the flare map 600, 610 are known to those of ordinary skill in the art.

In method block 250, the reticle is fabricated based on the layout changes resulting from the OPC analysis. Because the features of the neighboring die locations 410A-H are considered in the generation of the flare map, and the flare map is replicated to cover the entire exposure field, the OPC analysis is more accurate, resulting in a more accurate pattern on the wafer. Increased pattern accuracy can result in increased performance and yield for the fabricated integrated circuit devices.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

I claim:

1. A method, comprising:
   receiving a layout file for a reticle used to pattern a first die location in a computing apparatus, the layout file defining a plurality of kerf features;
   defining a flare map calculation area for the first die location covering at least a portion of a kerf region surrounding the first die location in the computing apparatus;
   copying features in the layout file into the region corresponding to the flare map calculation area that are associated with the patterning of die locations neighboring the first die location in the computing apparatus to generate a modified layout file; and
   calculating a flare map of the portion of the kerf region included in the flare map calculation area based on the modified layout file in the computing apparatus, wherein the flare map calculation area covers a first vertical kerf region and a first horizontal kerf region, and copying the features in the layout file further comprises:
   copying kerf features from a second vertical kerf region opposing the first vertical kerf region to the first vertical kerf region; and
   copying kerf features from a second horizontal kerf region opposing the first horizontal kerf region to the first horizontal kerf region.

2. The method of claim 1, further comprising performing an optical proximity correction analysis of the reticle using the flare map to generate a corrected layout file.

3. The method of claim 2, further comprising fabricating the reticle using the corrected layout file.

4. The method of claim 1, wherein calculating the flare map further comprises:
   replicating a first portion of the flare map associated with the first vertical kerf region for the second vertical kerf region; and
   replicating a second portion of the flare map associated with the first horizontal kerf region for the second horizontal kerf region opposing the first horizontal kerf region.

5. A non-transitory program storage device programmed with instructions, that when executed in a computing apparatus, perform a method, comprising:
   receiving a layout file for a reticle used to pattern a first die location in the computing apparatus, the layout file defining a plurality of kerf features;
   defining a flare map calculation area for the first die location covering at least a portion of a kerf region surrounding the first die location in the computing apparatus;
   copying features in the layout file into the region corresponding to the flare map calculation area that are associated with the patterning of die locations neighboring the first die location in the computing apparatus to generate a modified layout file; and
   calculating a flare map of the portion of the kerf region included in the flare map calculation area based on the modified layout file in the computing apparatus, wherein the flare map calculation area covers a first vertical kerf region and a first horizontal kerf region, and copying the features in the layout file in the method further comprises:
   copying kerf features from a second vertical kerf region opposing the first vertical kerf region to the first vertical kerf region; and
   copying kerf features from a second horizontal kerf region opposing the first horizontal kerf region to the first horizontal kerf region.

6. The program storage device of claim 5, wherein the method further comprises performing an optical proximity correction analysis of the reticle using the flare map to generate a corrected layout file.

7. The program storage device of claim 5, wherein calculating the flare map in the method further comprises:
   replicating a first portion of the flare map associated with the first vertical kerf region for the second vertical kerf region; and
   replicating a second portion of the flare map associated with the first horizontal kerf region for the second horizontal kerf region opposing the first horizontal kerf region.

8. A system, comprising:
   means for receiving a layout file for a reticle used to pattern a first die location, the layout file defining a plurality of kerf features;
   means for defining a flare map calculation area for the first die location covering at least a portion of a kerf region surrounding the first die location;
   means for copying features in the layout file into the region corresponding to the flare map calculation area that are associated with the patterning of die locations neighboring the first die location to generate a modified layout file; and
   means for calculating a flare map of the portion of the kerf region included in the flare map calculation area based on the modified layout file, wherein the flare map calculation area covers a first vertical kerf region and a first horizontal kerf region, and the means for copying the features in the layout file further comprises:
   means for copying kerf features from a second vertical kerf region opposing the first vertical kerf region to the first vertical kerf region; and
   means for copying kerf features from a second horizontal kerf region opposing the first horizontal kerf region to the first horizontal kerf region.

9. The system of claim 8, further comprising means for performing an optical proximity correction analysis of the reticle using the flare map to generate a corrected layout file.

10. The system of claim 8, wherein the means for calculating the flare map further comprises:
    means for replicating a first portion of the flare map associated with the first vertical kerf region for the second vertical kerf region; and
    means for replicating a second portion of the flare map associated with the first horizontal kerf region for the second horizontal kerf region opposing the first horizontal kerf region.

11. A method, comprising:
    receiving a layout file for a reticle used to pattern a first die location in a computing apparatus, the layout file defining a plurality of kerf features;

defining a flare map calculation area for the first die location covering at least a portion of a kerf region surrounding the first die location in the computing apparatus, wherein the flare map calculation area covers top, bottom, left, and right regions of the kerf region;

copying features in the layout file into the region corresponding to the flare map calculation area that are associated with the patterning of die locations neighboring the first die location in the computing apparatus to generate a modified layout file, wherein copying the features in the layout file further comprises:

copying kerf features from the top kerf region to the bottom kerf region;

copying kerf features from the bottom kerf region to the top kerf region;

copying kerf features from the left kerf region to the right kerf region; and copying kerf features from the right kerf region to the left kerf region; and calculating a flare map of the portion of the kerf region included in the flare map calculation area based on the modified layout file in the computing apparatus.

12. A non-transitory program storage device programmed with instructions, that when executed in a computing apparatus, perform a method, comprising:

receiving a layout file for a reticle used to pattern a first die location in the computing apparatus, the layout file defining a plurality of kerf features;

defining a flare map calculation area for the first die location covering at least a portion of a kerf region surrounding the first die location in the computing apparatus, wherein the flare map calculation area covers top, bottom, left, and right regions of the kerf region;

copying features in the layout file into the region corresponding to the flare map calculation area that are associated with the patterning of die locations neighboring the first die location in the computing apparatus to generate a modified layout file, wherein copying the features in the layout file in the method further comprises:

copying kerf features from the top kerf region to the bottom kerf region;

copying kerf features from the bottom kerf region to the top kerf region;

copying kerf features from the left kerf region to the right kerf region; and copying kerf features from the right kerf region to the left kerf region; and calculating a flare map of the portion of the kerf region included in the flare map calculation area based on the modified layout file in the computing apparatus.

13. A system, comprising:

means for receiving a layout file for a reticle used to pattern a first die location, the layout file defining a plurality of kerf features;

means for defining a flare map calculation area for the first die location covering at least a portion of a kerf region surrounding the first die location, wherein the flare map calculation area covers top, bottom, left, and right regions of the kerf region;

means for copying features in the layout file into the region corresponding to the flare map calculation area that are associated with the patterning of die locations neighboring the first die location to generate a modified layout file, wherein the means for copying the features in the layout file further comprises:

means for copying kerf features from the top kerf region to the bottom kerf region;

means for copying kerf features from the bottom kerf region to the top kerf region;

means for copying kerf features from the left kerf region to the right kerf region; and means for copying kerf features from the right kerf region to the left kerf region; and means for calculating a flare map of the portion of the kerf region included in the flare map calculation area based on the modified layout file.

* * * * *